US00RE44473E

(19) United States
(12) Reissued Patent
Cho

(10) Patent Number: US RE44,473 E
(45) Date of Reissued Patent: Sep. 3, 2013

(54) METHOD FOR FABRICATING SEMICONDUCTOR DEVICE WITH VERTICAL CHANNEL TRANSISTOR

(75) Inventor: Sang-Hoon Cho, Kyoungki-do (KR)

(73) Assignee: Hynix Semiconductor Inc., Gyeonggi-do (KR)

(21) Appl. No.: 13/405,507

(22) Filed: Feb. 27, 2012

Related U.S. Patent Documents

Reissue of:
(64) Patent No.: 7,670,909
Issued: Mar. 2, 2010
Appl. No.: 12/163,304
Filed: Jun. 27, 2008

(30) Foreign Application Priority Data

Dec. 24, 2007 (KR) ..... 10-2007-0136437

(51) Int. Cl.
*H01L 29/732* (2006.01)

(52) U.S. Cl.
USPC ..... 438/268; 438/270; 257/328; 257/E21.41; 257/E21.325

(58) Field of Classification Search
USPC ..... 438/268, 270, 758, 761, 778; 257/327, 257/328, E21.325, E21.41
See application file for complete search history.

(56) References Cited

U.S. PATENT DOCUMENTS 5,776,815 A * 7/1998 Pan et al. ..... 438/396
6,403,421 B1 * 6/2002 Ikeda et al. ..... 438/267
7,482,229 B2 * 1/2009 Juengling ..... 438/268
7,759,198 B2 * 7/2010 Seo et al. ..... 438/268
2006/0097304 A1 5/2006 Yoon et al.
2007/0004129 A1 * 1/2007 Lee et al. ..... 438/243
2007/0012996 A1 1/2007 Yoon et al.
2007/0020855 A1 * 1/2007 Kim et al. ..... 438/268
2007/0080385 A1 * 4/2007 Kim et al. ..... 257/296
2007/0087499 A1 * 4/2007 Seo et al. ..... 438/243
2007/0111455 A1 * 5/2007 Kim et al. ..... 438/286

(Continued)

FOREIGN PATENT DOCUMENTS

CN 101009284 8/2007
CN 101043031 9/2007

(Continued)

OTHER PUBLICATIONS

Wolf et al., Silicon Processing for the VLSI Era, vol. 1—Process Technology, Second Edition, California: Lattice Press, 2000, p. 193-197.*

(Continued)

*Primary Examiner* — Michele Fan
(74) *Attorney, Agent, or Firm* — IP & T Group LLP

(57) ABSTRACT

A method for fabricating a semiconductor memory device with a vertical channel transistor includes forming a plurality of pillars each having a hard mask pattern thereon over a substrate, each of the plurality of pillars comprising an upper pillar and a lower pillar; forming a surround type gate electrode surrounding the lower pillar; forming an insulation layer filling a space between the pillars; forming a preliminary trench by primarily etching the insulation layer using a mask pattern for a word line until a portion of the upper pillar is exposed; forming a buffer layer over a resultant structure including the preliminary trench except on a bottom of the preliminary trench; and forming a trench for a word line by secondarily etching the insulation layer until the surround type gate electrode is exposed.

28 Claims, 9 Drawing Sheets

(56) References Cited

U.S. PATENT DOCUMENTS

| | | | | |
|---|---|---|---|---|
| 2007/0178647 | A1* | 8/2007 | Wu et al. | 438/270 |
| 2007/0181925 | A1* | 8/2007 | Yoon et al. | 257/296 |
| 2007/0190766 | A1* | 8/2007 | Seo et al. | 438/585 |
| 2008/0099040 | A1* | 5/2008 | Bahng et al. | 134/1.3 |
| 2008/0205133 | A1* | 8/2008 | Gonzalez et al. | 365/185.01 |

FOREIGN PATENT DOCUMENTS

| | | |
|---|---|---|
| JP | 02-113571 | 4/1990 |
| JP | 08-330532 | 12/1996 |
| JP | 11-103026 | 4/1999 |
| JP | 2003-152103 | 5/2003 |
| JP | 2007-201454 | 8/2007 |
| JP | 2008-511165 | 4/2008 |
| KR | 10-0615735 | 5/2001 |
| KR | 100660881 | 12/2006 |
| KR | 1020070038233 | 10/2007 |
| TW | 326553 | 2/1998 |
| TW | 578299 | 3/2004 |
| TW | 200618181 | 6/2006 |

OTHER PUBLICATIONS

Search Report issued by the Taiwanese Intellectual Property Office on Apr. 24, 2012.

Patent Certificate and Publication of Granted Chinese Application issued by the Chinese Patent Office on Feb. 27, 2013.

Notice of Allowance issued by the Japanese Patent Office on May 14, 2013.

Liu et al., "Generating sub-30-nm polysilicon gates using PECVD amorphous carbon as hardmask and anti-reflective coating," Optical Microlithography XVI. Proceedings of the SPIE, vol. 5040 (2003): pp. 841-848.*

Notice of Allowance for Korean Patent Application No. 10-2007-0136437, (Date: Jun. 8, 2009).

* cited by examiner

Y-Y'

Y-Y'

Y-Y'

METHOD FOR FABRICATING SEMICONDUCTOR DEVICE WITH VERTICAL CHANNEL TRANSISTOR

Matter enclosed in heavy brackets [ ] appears in the original patent but forms no part of this reissue specification; matter printed in italics indicates the additions made by reissue.

CROSS-REFERENCE TO RELATED APPLICATIONS

The present invention claims priority of Korean patent application number 2007-0136437, filed on Dec. 24, 2007, which is incorporated by reference in its entirety.

BACKGROUND OF THE INVENTION

The present invention relates to semiconductor device fabrication technology, and more particularly, to a method for fabricating a semiconductor device with a vertical channel transistor.

As the integration degree of a semiconductor device increases, a channel length of a transistor is gradually reduced, causing device characteristics to be deteriorated due to a short channel effect. To avoid the short channel effect, there have been proposed various methods of reducing a depth of a junction region or relatively increasing a channel length by recessing a channel region of a transistor.

However, there is an increasing demand for a smaller-sized transistor as the integration density of a semiconductor memory device such as a dynamic random access memory (DRAM) approaches gigabit scale. Recently, a transistor of a DRAM requires a device area of $4F^2$ (F: minimum feature size). Therefore, it is difficult to meet the requirement for a device area despite the scaling-down of a channel length in a typical planar transistor structure where a gate electrode is formed over a substrate and junction regions are formed at both sides of the gate electrode.

SUMMARY OF THE INVENTION

To meet such a requirement for a limited device area, a vertical channel transistor has been suggested, which will be described in detail with reference to FIG. 1.

FIG. 1 illustrates a perspective view and a plan view of a vertical channel transistor. Referring to FIG. 1, a plurality of pillars P, which are arranged in a first direction (X-X') and a second direction (Y-Y') crossing the first direction, are formed over a substrate 100. The pillar P is formed by etching the substrate 100 using a hard mask pattern (not shown). The pillar P may have a cylindrical structure.

Buried bit lines 101, surrounding the pillar P and extending in the first direction, are formed in the substrate 100 between columns of the pillars P arranged in the first direction. The buried bit lines 101 are isolated from each other by a trench T for device isolation.

A surround type gate electrode (not shown) surrounding the pillar P is formed on a circumferential surface of the pillar P. A word line 102 is formed such that it is electrically connected to the surround type gate electrode and extends in the second direction. A storage electrode 104 is formed on top of the pillar P. A contact plug 103 may be interposed between the pillar P and the storage electrode 104.

In the vertical channel transistor where a channel is formed vertically with respect to a surface of the substrate, a channel length can be increased without being limited to a device area, thus preventing the short channel effect. However, there is a limitation in a process for forming the word line 102, resulting in a device failure. Hereinafter, one method for fabricating the vertical channel transistor in the substrate and the limitation thereof will be described in detail with reference to FIGS. 2A to 2C.

FIGS. 2A to 2C illustrate a method for fabricating a semiconductor device having a vertical channel transistor. Particularly, FIGS. 2A to 2C illustrate cross-sectional views taken along line Y-Y' of FIG. 1, i.e., the second direction. Like reference numerals in FIGS. 2A to 2C denote like elements in FIG. 1. Since the accompanying drawings are provided to explain the limitation in a specific process for forming a word line, detailed descriptions for unrelated parts will be omitted herein.

Referring to FIG. 2A, a semiconductor substrate 100 is provided, including a plurality of pillars P arranged in a first direction and a second direction crossing the first direction. A surround type gate electrode 203 is formed surrounding a lower portion of the pillar P. Buried bit lines 101 are formed in the substrate 100 between the pillars P arranged in the first direction, surrounding the pillar P and extending in the first direction. The buried bit lines 101 are isolated from each other by a trench T for device isolation. A first hard mask pattern 201 is formed on the pillar P and a spacer 202 is formed on sidewalls of an upper portion of the pillar P and sidewalls of the first hard mask pattern 201.

An oxide layer 204 is formed over a resultant structure, and then planarized through chemical mechanical polishing (CMP) process until the first hard mask pattern 201 is exposed. After a second hard mask 205 is formed on the planarized resultant structure, a photoresist pattern 207 is formed over the hard mask 205 for the purpose of forming a word line. An anti-reflective layer 206 may be formed under the photoresist pattern 207 to prevent reflection during photo exposure process.

Referring to FIG. 2B, the second hard mask 205 is etched, using the photoresist pattern 207 as an etch barrier, to form a second hard mask pattern 205A exposing the oxide layer 204 corresponding to a region where a word line will be formed. Here, an overlay error of a mask during the process of forming the photoresist pattern 207 may lead to misalignment between the second hard mask pattern 205A and the first hard mask pattern 201 and the pillar P (see dotted circle regions in FIG. 2B). Such a phenomenon of overlay error and misalignment becomes more serious as a semiconductor device is highly integrated and smaller-sized.

Referring to FIG. 2C, the oxide layer 204 is dry-etched using the second hard mask pattern 205A as an etch barrier until an upper portion of the surround type gate electrode 203 is exposed, thereby forming a trench for a word line. Thereafter, a conductive layer for a word line is formed over a resultant structure, and an etch-back process is performed on the conductive layer to a predetermined point lower than the top surface of the pillar P. As a result, a word line 102 is formed partially filling the trench for the word line. The word line 102 extends in the second direction and is electrically connected to the surround type gate electrode 203.

During the dry etching of the oxide layer 204 and the etch-back process of the conductive layer for the word line, the first hard mask pattern 201 and the spacer 202 may be lost due to the misalignment between the second hard mask pattern 205A and the first hard mask pattern 201 and the pillar P. This, in accordance with this less preferred technique, may cause an upper portion of the pillar P to be attacked and lost (see "A" in FIG. 2C).

Hence, it is required to develop a new, more preferred fabrication technique capable of preventing the pillar P from being attacked by minimizing the losses of the hard mask pattern 201 and the spacer 202 even though the misalignment occurs due to an overlay error of a mask.

At least one preferred embodiment of the present invention is therefore directed to providing a method for fabricating a semiconductor device with a vertical channel transistor, which can minimize losses of a hard mask pattern and a spacer to prevent a pillar from being damaged, by dividing a process of forming a trench for a word line into two sub processes and performing a process of forming a buffer layer between the two sub processes.

In accordance with an aspect of the present invention, there is provided a method for fabricating a semiconductor memory device with a vertical channel transistor. The method includes forming a plurality of pillars each having a hard mask pattern thereon over a substrate, each of the plurality of pillars comprising an upper pillar and a lower pillar; forming a surround type gate electrode surrounding the lower pillar; forming an insulation layer filling a space between the pillars; forming a preliminary trench by primarily etching the insulation layer using a mask pattern for a word line until a portion of the upper pillar is exposed; forming a buffer layer over a resultant structure including the preliminary trench except on a bottom of the preliminary trench; and forming a trench for a word line by secondarily etching the insulation layer until the surround type gate electrode is exposed.

DESCRIPTION OF SPECIFIC EMBODIMENTS

Figure 1:
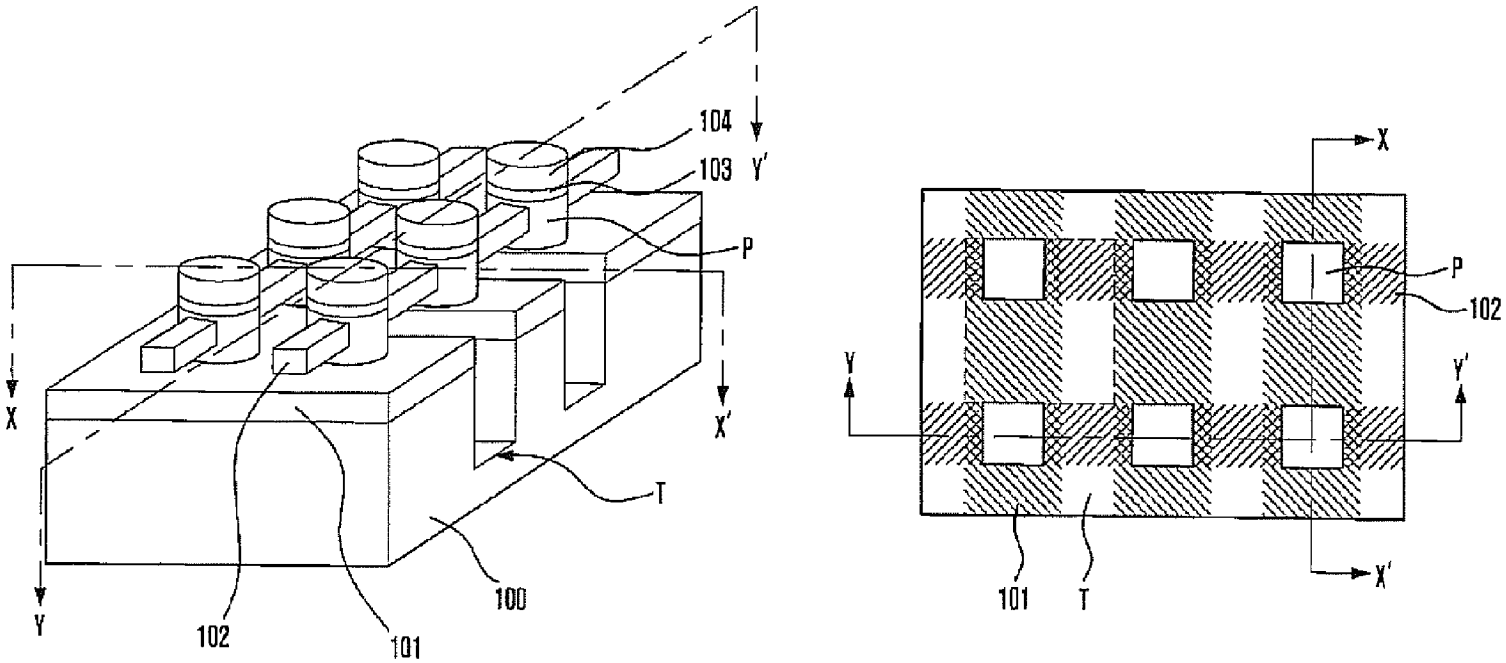
FIG. 1 illustrates a perspective view and a plan view of a vertical channel transistor in accordance with one embodiment of the present invention.

FIGS. 3A to 3J illustrate a method for fabricating a vertical channel transistor in a semiconductor device in accordance with an embodiment of the present invention. In particular, FIGS. 3A to 3J illustrate cross-sectional views taken along line Y-Y" of FIG. 1, i.e., a second direction.

Figure 3A:
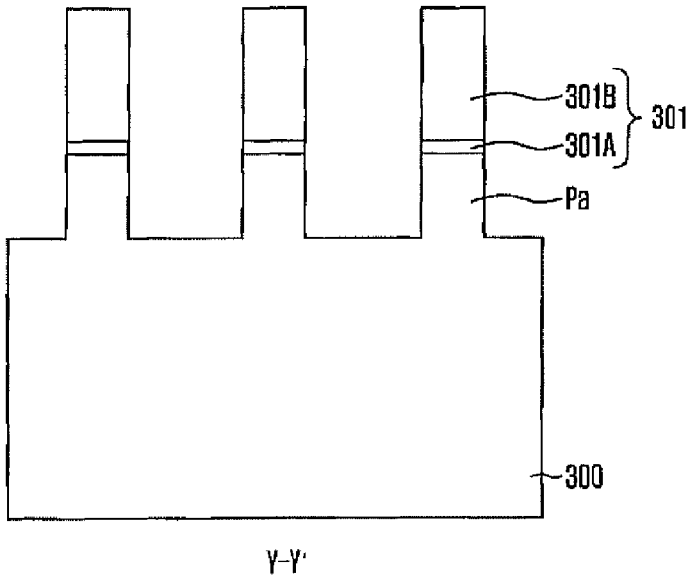
FIGS. 3A to 3J illustrate a method for fabricating a vertical channel transistor in a semiconductor device in accordance with a preferred embodiment of the present invention.

Referring to FIG. 3A, a plurality of first hard mask patterns 301, which are arranged in a first direction and a second direction crossing the first direction, are formed over a substrate 300. Preferably, the first hard mask pattern 301 has a multi-layered structure of an oxide layer 301A and a nitride layer 301B. The substrate 300 is etched to a predetermined depth using the first hard mask pattern 301 as an etch barrier to thereby form an upper pillar Pa.

Figure 3B:
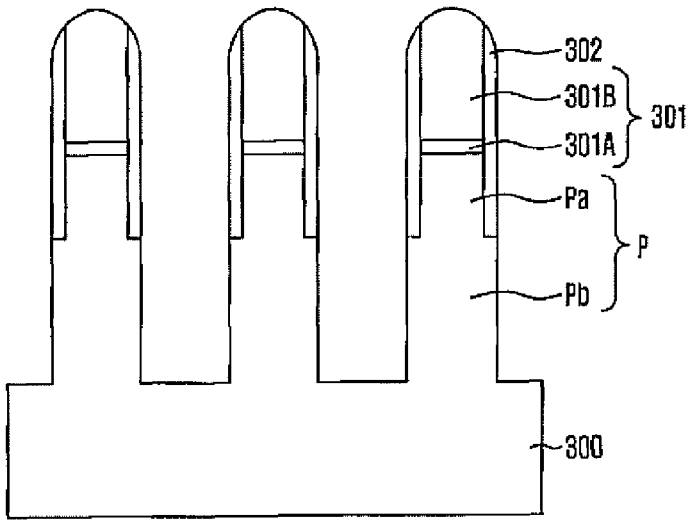

Referring to FIG. 3B, a spacer 302 is formed on sidewalls of the first hard mask pattern 301 and the upper pillar Pa. Preferably, the spacer 302 is formed of a nitride. The exposed substrate 300 is etched to a predetermined depth using the first hard mask pattern 301 and the spacer 302 as etch barriers, thereby forming a preliminary lower pillar Pb under the upper pillar Pa. As a result, preliminary pillars P arranged in the first and second directions are formed, each of which includes the upper pillar Pa and the preliminary lower pillar Pb. Although an initial plan view shape of the first hard mask pattern 301 is rectangular, the first hard mask pattern 301 and the pillar P may have a substantially cylindrical structure while undergoing etching processes.

Figure 3C:
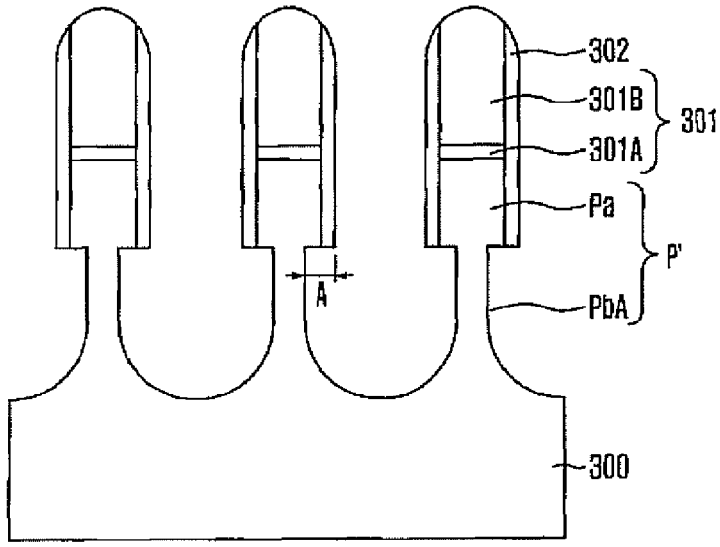

Referring to FIG. 3C, the exposed substrate 300 is isotropically etched, using the first hard mask pattern 301 and the spacer 302 as etch barriers, to recess the preliminary lower pillar Pb to a predetermined depth A. As a result, a pillar P' for an active region is formed, which includes the upper pillar Pa and a lower pillar PbA.

Figure 3D:
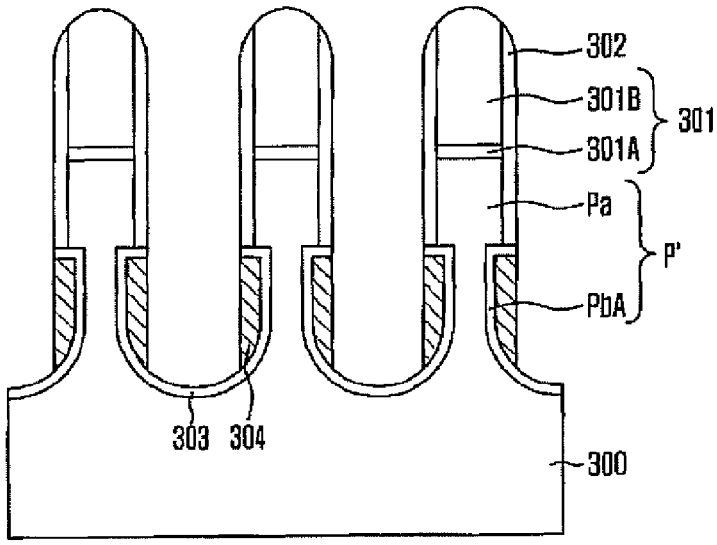

Referring to FIG. 3D, a gate dielectric layer 303 is formed on the surface of the substrate 300 exposed by the isotropic etch. A conductive layer for a gate electrode, for example, a polysilicon layer, is formed over a resultant structure, and then an etch-back process is performed on the conductive layer until the gate dielectric layer 303 is exposed. Thus, a surround type gate electrode 304 is formed, which surrounds a circumferential surface of the lower pillar PbA.

Figure 3E:
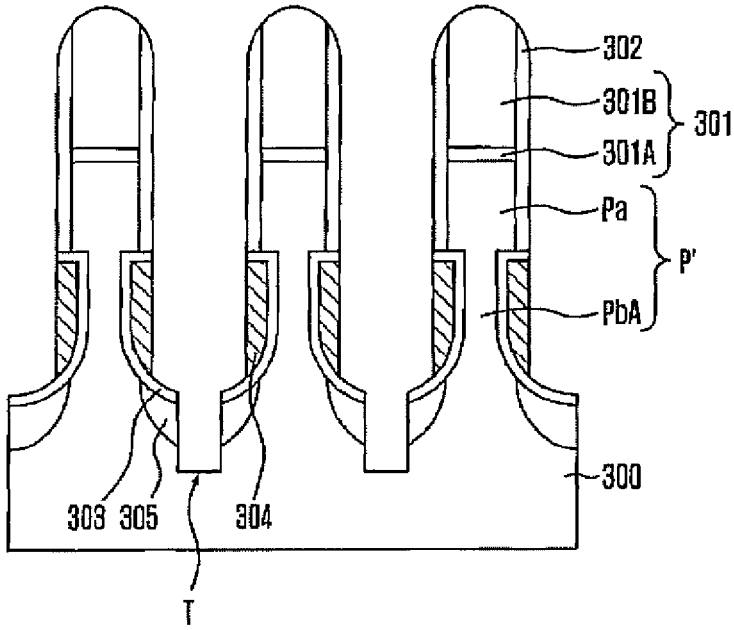

Referring to FIG. 3E, impurities 305 are doped into the substrate 300 between the pillars P' to form an impurity region for a buried bit line. Then, a trench T for device isolation, which extends in the first direction, is formed to a depth enough to penetrate the impurity region in the substrate 300 between columns of the pillars P' arranged in the first direction. Consequently, buried bit lines are formed, which surround the pillar P' and extend in the first direction.

Figure 3F:
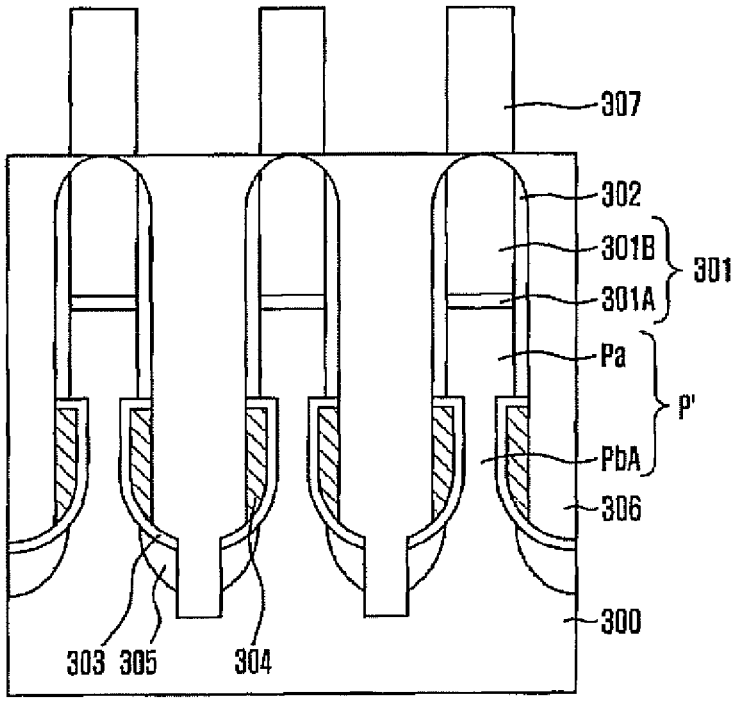

Referring to FIG. 3F, an oxide layer 306 is formed over a resultant structure and then planarized using a CMP process until the first hard mask pattern 301 is exposed. Thereafter, a second hard mask is formed over the planarized resultant structure and patterned using a photoresist pattern (not shown), thereby forming a second hard mask pattern 307 exposing the oxide layer 306 corresponding to a region where a word line will be formed. Preferably, the second hard mask pattern 307 is formed of an amorphous carbon.

Figure 2A:
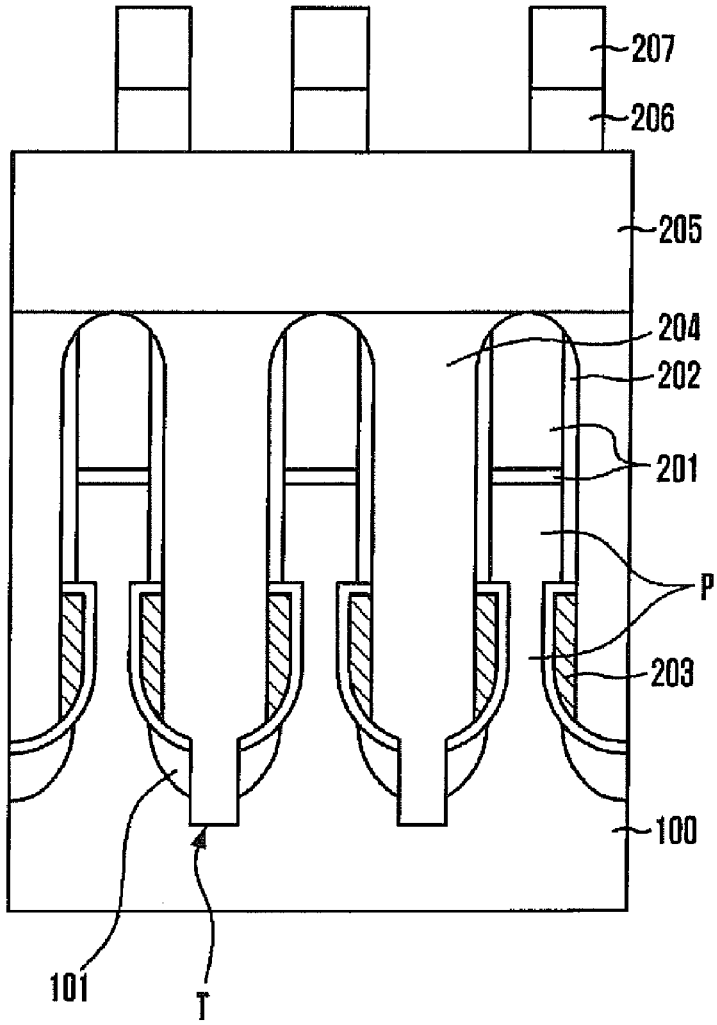
FIG. 2A (PRIOR ART)
FIGS. 2A to 2C illustrate a method for fabricating a vertical channel transistor in a semiconductor device.
Figure 2B:
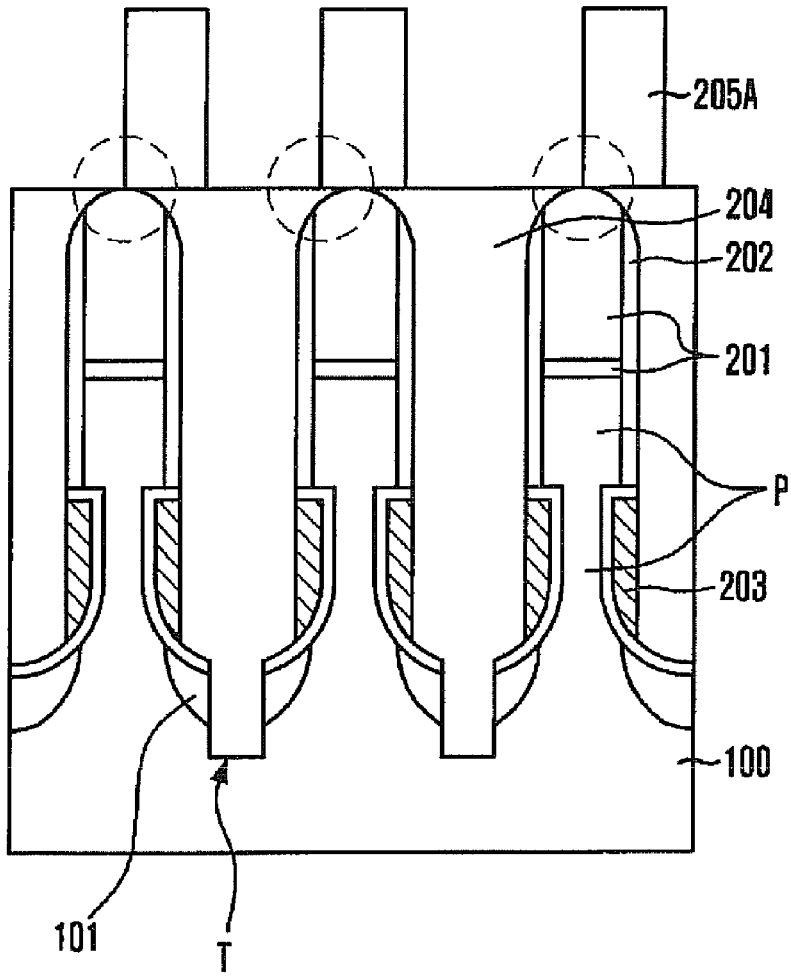
FIG. 2B (PRIOR ART)
Figure 2C:
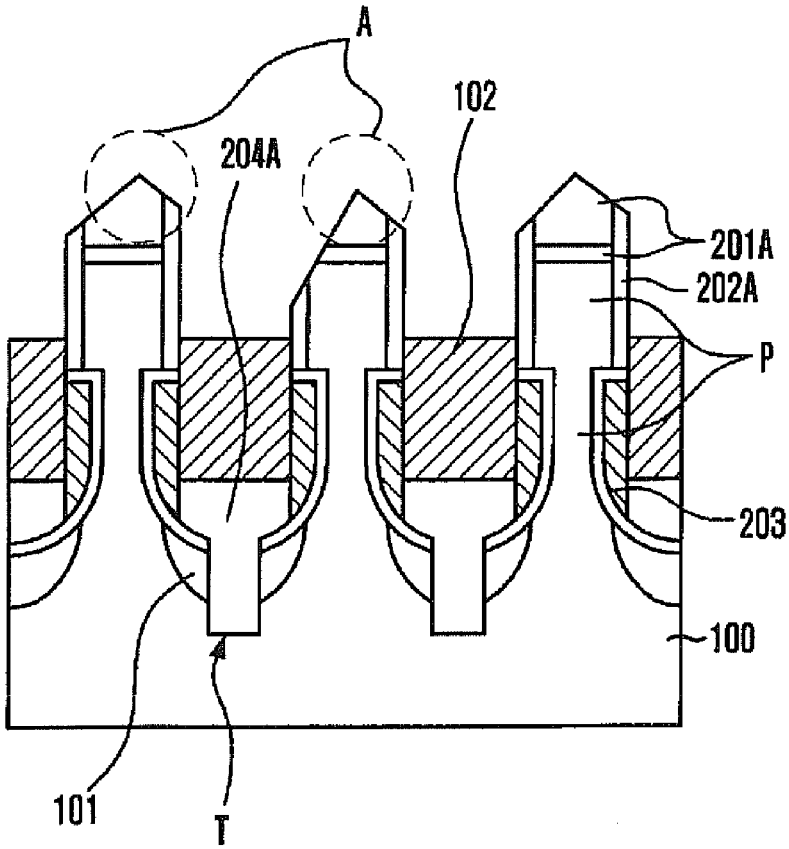
FIG. 2C (PRIOR ART)
Figure 3G:
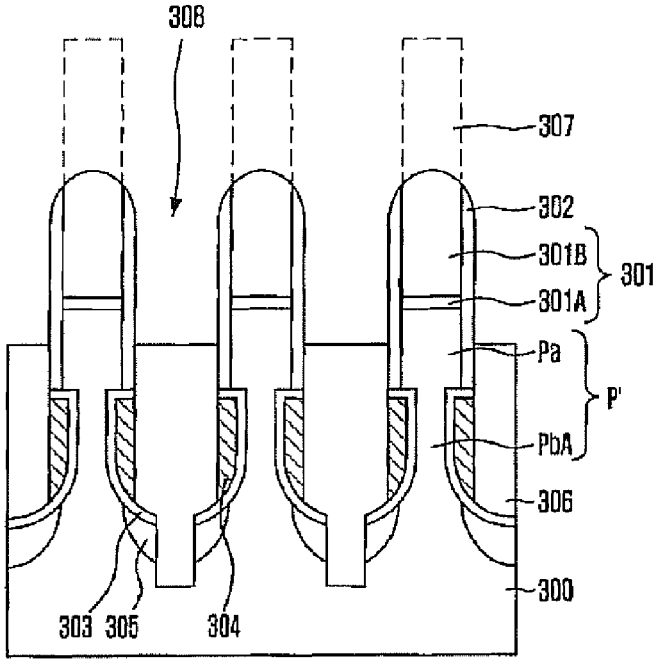

Referring to FIG. 3G, a primary dry etching process is performed on the oxide layer 306 using the second hard mask pattern 307 as an etch barrier until a portion of the upper pillar Pa (preferably, about half the upper pillar Pa) is exposed, thereby forming a preliminary trench 308 for a word line. Compared to the method explained referring to FIGS. 2A to 2C, where the oxide layer is dry-etched until the surround type gate electrode is exposed, the etching amount of the oxide layer 306 is significantly reduced. Therefore, losses of the first hard mask pattern 301 and the spacer 302 on sidewalls thereof are negligible during the primary dry etching process, preventing the upper pillar Pa from being damaged or lost during a subsequent process.

Then, the second hard mask pattern 307 is removed. If the second hard mask pattern 307 is formed of an amorphous carbon, the second hard mask pattern 307 can be removed easily through a removal process using oxygen ($O_2$) plasma.

Figure 3H:
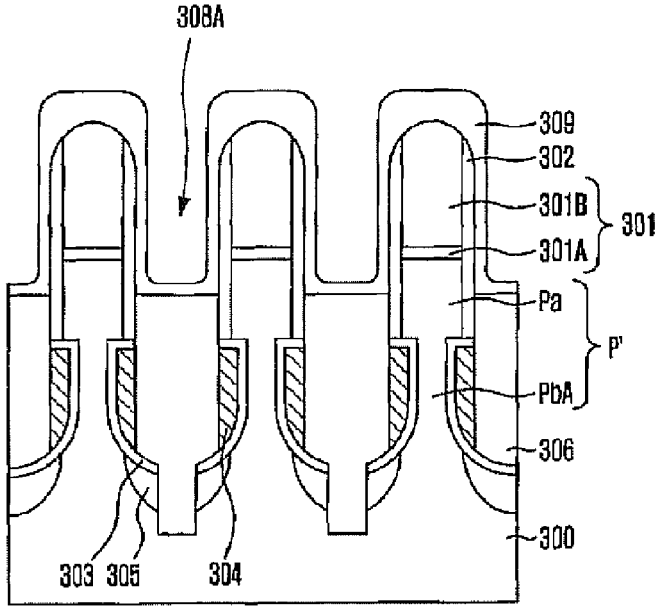

Referring to FIG. 3H, to protect the first hard mask pattern 301 and the spacer 302 on the sidewalls thereof, a buffer layer 309 is formed over a resultant structure where the preliminary trench 308 is formed. The buffer layer 309 is formed of an insulation material. Especially, it is preferable that the buffer layer 309 is formed of ozone-undoped silicate glass ($O_3$-USG), a boro-phospho silicate glass (BPSG), or a plasma enhanced tetra ethyl ortho silicate (PETEOS). The buffer layer 309 formed on the first hard mask pattern 301 and the sidewalls of the preliminary trench 308 are relatively thicker than the buffer layer 309 formed on a bottom of the preliminary trench 308. A reference numeral 308A represents a narrowed preliminary trench after the buffer layer 309 is formed.

Figure 3I:
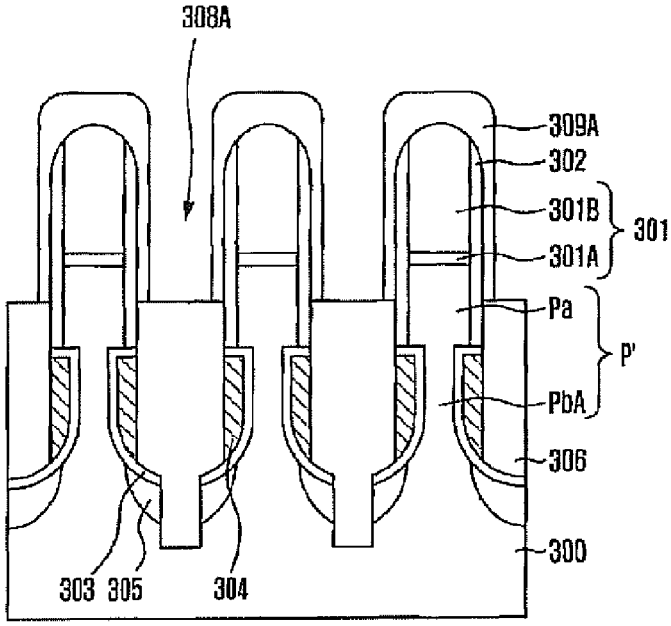

Referring to FIG. 3I, the thin buffer layer 309 formed on the bottom of the preliminary trench 308 is removed to expose the oxide layer 306, preferably by a wet etching process using a buffer oxide etchant (BOE) solution.

Figure 3J:
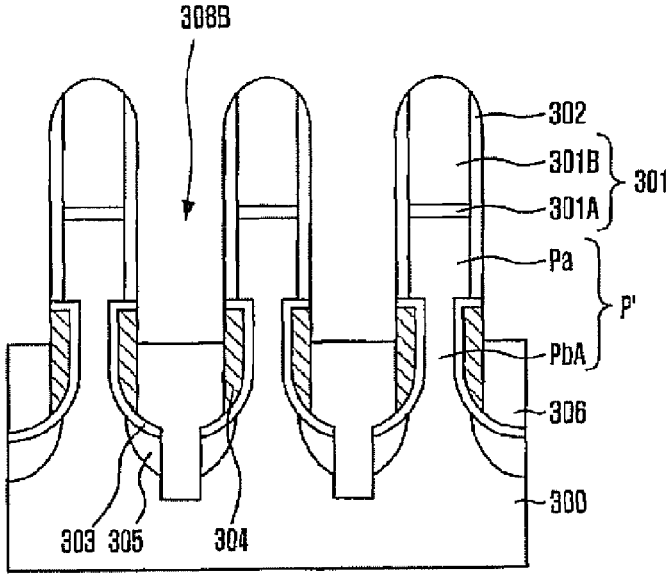

Referring to FIG. 3J, a second dry etching process is performed on the oxide layer 306 until an upper portion of the surround type gate electrode 304 is exposed, thereby forming a trench 308B for a word line. Since the hard mask pattern 301 and the spacer 302 are protected by the buffer layer 309, it is possible to prevent the upper pillar Pa from being attacked or damaged. Thereafter, the buffer layer 309 is removed.

Although not shown herein, a conductive layer is filled into the trench 308B to form a word line (not shown) extending in the second direction and electrically connecting the surround type gate electrode 304.

In the above preferred method of forming the semiconductor memory device with the vertical channel transistor, the process of forming the trench for a word line comprises the first and second dry etching processes, and the buffer layer 309 is formed after the formation of the preliminary trench 308 by the first dry etching process. Accordingly, the trench 308B for a word line is formed in a state that the hard mask pattern 301 and the spacer 302 are protected by the buffer layer 309. This makes it possible to effectively prevent the upper pillar Pa from being damaged or lost as could occur with the less preferred technique.

As described above, in accordance with the preferred embodiment of present invention, a process of forming a trench for a word line comprises two sub processes, and a process of forming a buffer layer is performed between the two sub processes. Consequently, it is possible to minimize losses of a hard mask pattern and spacer, thereby preventing damage or loss of a pillar.

While the present invention has been described with respect to the specific embodiments, it will be apparent to those skilled in the art that various changes and modifications may be made without departing from the spirit and scope of the invention as defined in the following claims.

What is claimed is:

1. A method of fabricating a semiconductor memory device with a vertical channel transistor, the method comprising:

forming a plurality of pillars on a substrate, each of the plurality of pillars comprising an upper pillar and a lower pillar and having a first hard mask pattern on the upper pillar;

forming a surround type gate electrode surrounding the lower pillar;

forming an insulation layer filling a space between the pillars;

forming a preliminary trench by etching the insulation layer using a second hard mask pattern [for a word line], *corresponding to a region where a word line is to be formed,* until a portion of the upper pillar is exposed;

forming a buffer layer on top of the first hard mask and sidewalls of the preliminary trench; and forming a trench for a word line by etching the insulation layer until a portion of the surround type gate electrode is exposed.

2. The method of claim 1, wherein forming the plurality of pillars comprises forming a spacer over *sidewalls of* the *first* hard mask pattern and [sidewalls of] the upper pillar.

3. The method of claim 2, wherein the *first* hard mask pattern and the spacer comprise a nitride layer.

4. The method of claim 1, wherein forming the surround type gate electrode comprises:

recessing the lower pillar to a predetermined depth through an isotropic etch process;

forming a conductive layer for a gate electrode over a resultant structure; and performing an etch-back process on the conductive layer until the substrate is exposed.

5. The method of claim 4, further comprising forming a gate dielectric layer before forming the conductive layer for the gate electrode.

6. The method of claim 1, wherein forming the insulation layer filling the space between the pillars comprises:

forming the insulation layer over a resultant structure where the pillar and the surround type gate electrode are formed; and planarizing the insulation layer until the *first* hard mask pattern is exposed.

7. The method of claim 1, wherein the insulation layer is formed of an oxide.

8. The method of claim 1, wherein the *second hard* mask pattern [for the word line] is formed of an amorphous carbon.

9. The method of claim 8, further comprising, after forming the preliminary trench, removing the *second hard* mask pattern using a removal process.

10. The method of claim 1, wherein forming the preliminary trench is performed until a half the upper pillar is exposed.

11. The method of claim 1, wherein forming the buffer layer on top of the first hard mask and sidewalls of the preliminary trench comprises:

forming the buffer layer over a resultant structure after forming a preliminary trench; and removing *a portion of* the buffer layer on a bottom of the preliminary trench.

12. The method of claim 1, wherein the buffer layer is formed of an insulation material.

13. The method of claim [11] *12*, wherein the buffer layer is formed of one material selected from the group consisting of ozone-undoped silicate glass ($O_3$-USG), boro-phospho silicate glass (BPSG) and plasma enhanced tetra ethyl ortho silicate (PETEOS).

14. The method of claim [1] *11*, wherein removing *the portion of* the buffer layer is performed using wet etching.

15. The method of claim 1, further comprising:

removing the buffer layer after forming the trench for the word line; and partially filling the trench with a conductive layer to form a word line.

*16. A method for fabricating a semiconductor memory device with a vertical channel transistor, the method comprising:*

*forming a plurality of pillars on a substrate, each of the plurality of pillars having a first hard mask pattern;*

*forming an insulation layer filling a space between adjacent ones of the plurality of pillars;*

*forming, between the adjacent ones of the plurality of pillars, a preliminary trench by etching the insulation layer to a first depth using a second hard mask pattern corresponding to a region where a word line is to be formed;*

*forming a buffer layer on top of the first hard mask pattern and sidewalls of the preliminary trench; and*

*forming a trench by etching the insulation layer to a second depth that is greater than the first depth.*

*17. The method of claim 16, wherein forming the plurality of pillars comprises forming a spacer over sidewalls of the first hard mask pattern and an upper portion of each of the plurality of pillars.*

*18. The method of claim 17, wherein the first hard mask pattern and the spacer comprise a nitride layer.*

*19. The method of claim 16, further comprising forming a gate electrode and a gate dielectric layer for each of the plurality of pillars with the gate dielectric being located between the gate electrode and a respective pillar of the plurality of pillars.*

*20. The method of claim 16, wherein forming the insulation layer filling the space between the adjacent ones of the plurality of pillars comprises:*

*forming the insulation layer over a resultant structure after forming of the plurality of pillars on the substrate; and*

*planarizing the insulation layer until the first hard mask pattern is exposed.*

*21. The method of claim 16, wherein the insulation layer is formed of an oxide.*

*22. The method of claim 16, wherein the second hard mask pattern is formed of an amorphous carbon.*

*23. The method of claim 22, further comprising after forming the preliminary trench, removing the second hard mask pattern using a removal process.*

*24. The method of claim 16, wherein forming the buffer layer on top of the first hard mask and sidewalls of the preliminary trench comprises:*

*forming the buffer layer over a resultant structure after forming a preliminary trench; and*

*removing a portion of the buffer layer on a bottom of the preliminary trench.*

*25. The method of claim 16, wherein the buffer layer is formed of an insulation material.*

*26. The method of claim 25, wherein the buffer layer is formed of one material selected from the group consisting of ozone-undoped silicate glass ($O_3$-USG), boro-phospho silicate glass (BPSG) and plasma enhanced tetra ethyl ortho silicate (PETEOS).*

*27. The method of claim 24, wherein removing the portion of the buffer layer is performed using wet etching.*

*28. The method of claim 16, further comprising:*

*removing the buffer layer after forming the trench and partially filling the trench with a conductive layer.*

* * * * *